United States Patent
Osawa et al.

(10) Patent No.: US 6,941,956 B2
(45) Date of Patent: Sep. 13, 2005

(54) SUBSTRATE TREATING METHOD AND APPARATUS

(75) Inventors: Atsushi Osawa, Kyoto (JP); Masato Tanaka, Kyoto (JP); Shuzo Nagami, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 10/382,611

(22) Filed: Mar. 5, 2003

(65) Prior Publication Data

US 2003/0176078 A1 Sep. 18, 2003

(30) Foreign Application Priority Data

Mar. 18, 2002 (JP) .......................... 2002-074291
Mar. 19, 2002 (JP) .......................... 2002-075910

(51) Int. Cl.[7] ............... H01L 21/302; H01L 21/461; B05C 11/02; B05C 13/02
(52) U.S. Cl. .................... 134/61; 134/105; 134/902; 438/745
(58) Field of Search .................. 438/745; 134/1.3, 134/61, 105, 902

(56) References Cited

U.S. PATENT DOCUMENTS

| 3,869,313 | A | * | 3/1975 | Jones et al. ............. 134/73 |
| 5,288,333 | A | * | 2/1994 | Tanaka et al. ........... 134/31 |
| 6,253,775 | B1 | * | 7/2001 | Kitahara et al. ......... 134/108 |
| 6,344,403 | B1 | * | 2/2002 | Madhukar et al. ....... 438/503 |
| 6,383,723 | B1 | * | 5/2002 | Iyer et al. ............... 430/327 |

* cited by examiner

*Primary Examiner*—Alexander Ghyka
(74) *Attorney, Agent, or Firm*—Ostrolenk, Faber, Gerb & Soffen, LLP (57) ABSTRACT

A substrate treating method for treating substrates with a treating solution includes a step of heating a treating solution containing sulfuric acid, and treating, with the treating solution, the substrates coated with a film material including a high dielectric-constant material. The substrates with the high dielectric-constant material are treated appropriately by heating, before use, the treating solution containing sulfuric acid.

6 Claims, 7 Drawing Sheets

SUBSTRATE TREATING METHOD AND APPARATUS

BACKGROUND OF THE INVENTION (1) Field of the Invention

This invention relates to a substrate treating method and apparatus for performing a predetermined treatment on semiconductor wafers or glass substrates for liquid crystal displays (hereinafter simply called). More particularly, the invention relates to a technique for treating substrates coated with a film includes a high dielectric material such as oxidation hafnium oxide or zirconium oxide.

(2) Description of the Related Art

In the semiconductor field of recent years, multifunctional LSIs have been developed with an increasingly refined structure of devices such as transistors. While the operating speed of circuits has increased, the thinning of gate insulating oxide film is reaching the limit. That is, an increase of leak current occurring with the thinning of film poses a serious problem.

To solve this problem, oxide film used heretofore as the gate insulating film may be replaced by a high dielectric material which is attracting attention as a new material of high dielectric constant capable of suppressing leak current.

Such conventional construction has the following drawbacks.

High dielectric-constant materials that can be used in the semiconductor field include metal oxides such as aluminum and hafnium oxides. However, these oxides cannot be treated with an etching or cleaning solution used conventionally. Thus, although a high dielectric-constant material likely to replace the conventional material is under study, little progress has been made in its use.

In a semiconductor device, for example, it is considered essential to use a high dielectric material such as hafnium oxide or zirconium oxide for the gate insulating film in order to thin the gate insulating film for downsizing of the chip. High dielectric materials are chemically stable. Thus, when a thin film formed of a high dielectric material, e.g. hafnium oxide, is etched, hydrofluoric acid (fluoric acid) is used as an etching solution, and the substrate having a thin film of hafnium oxide formed thereon is immersed in fluoric acid for treatment.

However, fluoric acid cannot selectively etch only hafnium oxide, but will etch polysilicon or silicon oxide along with hafnium oxide.

SUMMARY OF THE INVENTION

This invention has been made having regard to the state of the art noted above, and its object is to provide a substrate treating method and apparatus for appropriately treating substrates having a high dielectric-constant material.

Another object of this invention is to provide a substrate treating method for selectively etching a film formed of a high dielectric material, and a substrate treating apparatus for appropriately executing this method.

Inventors attained the following finding to fulfill the above objects.

Inventors have carried out various experiments on the conditions that a high dielectric-constant material may be treated selectively, and that substrates are free from contamination by the high dielectric-constant material treated. It has been found as a result that the above conditions are met by heating a treating solution containing sulfuric acid.

Based on the above finding, this invention provides a substrate treating method for treating substrates with a treating solution, comprising the step of heating a treating solution containing sulfuric acid, and treating, with the treating solution, the substrates coated with a film material including a high dielectric-constant material.

Inventors have conducted experiment to heat a treating solution containing sulfuric acid, and treat the high dielectric-constant material with the heated treating solution. It has been found that the treating solution above a certain temperature is effective for treating the high dielectric-constant material. Inventors have confirmed that, by using the treating solution heated to such a temperature, the high dielectric-constant material can be selectively treated without contaminating the substrates. Thus, the substrates with the high dielectric-constant material may be treated appropriately by heating, before use, the treating solution containing sulfuric acid.

Based on various experiments, the treating solution, preferably, should be heated to a range of 100 to 200° C., preferably 150 to 180° C.

Various experiments show that the treating solution, preferably, has sulfuric acid in a concentration of 20 to 100% by weight.

The above method may be executed by a substrate treating apparatus for treating substrates coated with a film material containing a high dielectric-constant material, the apparatus comprising a treating tub for receiving and treating the substrates, a treating solution pipe for supplying a treating solution containing sulfuric acid to the treating tub, and a heating device for heating the treating solution.

The treating solution containing sulfuric acid is supplied to the treating tub through the treating solution pipe to treat the substrates. The substrates coated with the high dielectric-constant material may be treated appropriately by heating the treating solution with the heating device.

In another aspect of the invention, a substrate treating method is provided for etching a high dielectric film of metal oxide formed on substrates. This method comprises the steps of supplying sulfuric acid to the substrates for causing the sulfuric acid to react with the metal oxide constituting the high dielectric film, thereby forming a metal sulfate, and supplying deionized water to the substrates to dissolve the metal sulfate in the deionized water, thereby removing the metal sulfate from the substrates.

By supplying sulfuric acid to the substrates, e.g. immersing the substrates in sulfuric acid, the sulfuric acid reacts with the metal oxide constituting the high dielectric film on the substrates, thereby forming a metal sulfate. Next, by supplying deionized water to the substrates, e.g. immersing the substrates in deionized water, the metal sulfate dissolves in the deionized water to be removed from the substrates. Thus, the two steps are combined to etch the high dielectric film of metal oxide formed on the substrates.

In this way, the film of a high dielectric material can be etched without using fluoric acid as an etching solution. Thus, the high dielectric material formed on the substrates may be etched selectively.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIGS. 2A through 2C are views illustrating a specific treatment by the method according to the first embodiment, in which

DESCRIPTION OF THE PREFERRED EMBODIMENTS

Preferred embodiments of this invention will be described in detail hereinafter with reference to the drawings.

First Embodiment

<Substrate Treating Method>

Figure 1:
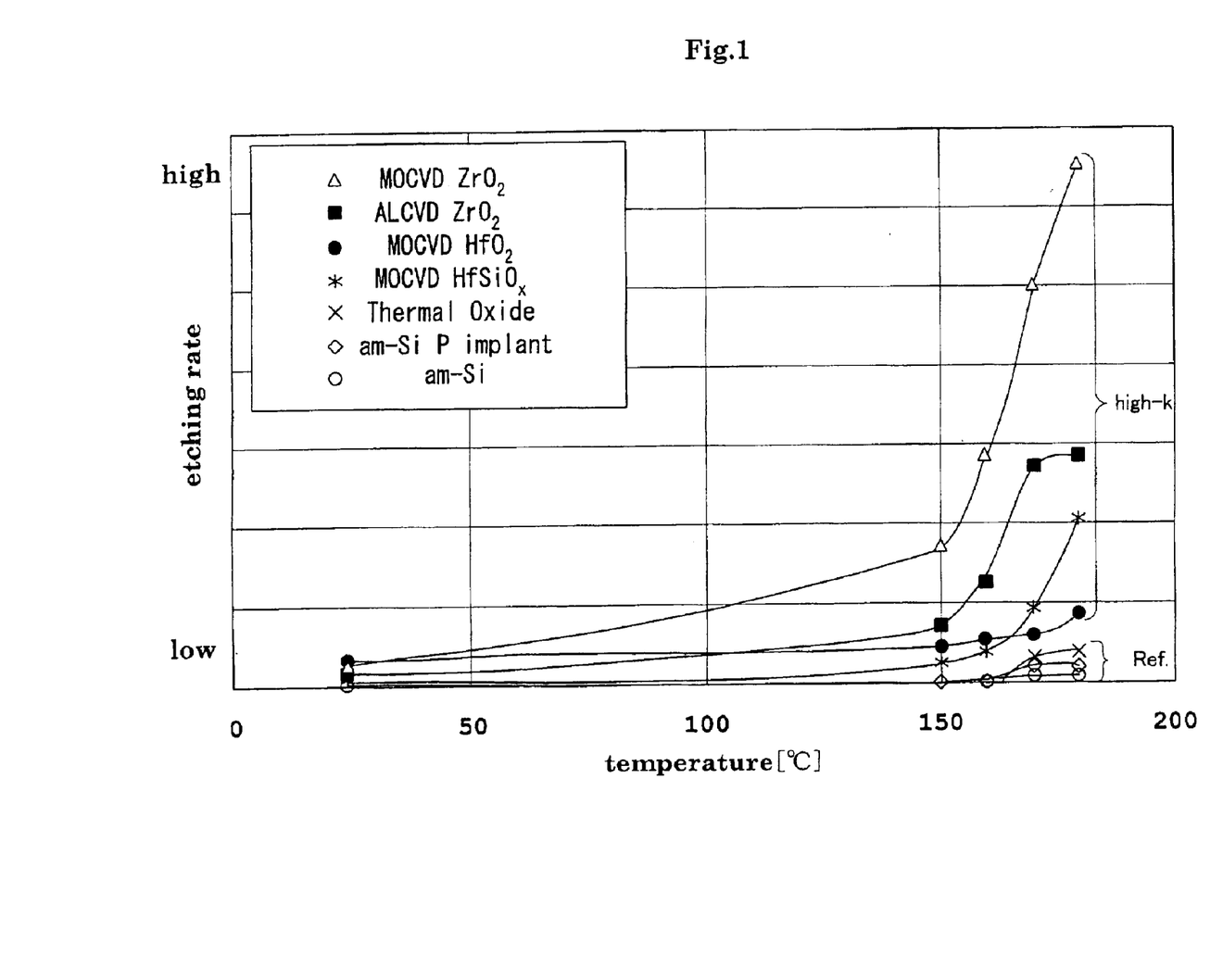
FIG. 1 is a graph showing results of experiment carried out on a method according to a first embodiment of this invention.

FIG. 1 is a graph showing results of experiment carried out on a method according to a first embodiment of this invention.

This graph shows etching rates as results of experiment carried out on etching of substrates coated with films containing high dielectric-constant materials. A treating solution containing sulfuric acid was used in the etching process, and the etching rates were measured at every temperature while heating the treating solution to varied temperatures.

Specific heating temperatures were 23° C., 150° C., 160° C., 170° C. and 180° C. The upper limit of heating temperature was 180° C. because of the heating limitation of the device used in the experiment.

The sulfuric acid concentration in the treating solution used in the experiment was 96% by weight. A similar effect is produced from a range of 20 to 100% by weight. Where the sulfuric acid concentration is less than 20% by weight, the etching rate is too low for practical purposes.

Samples were made by organic metal chemical vapor deposition (MO CVD) and atom layer chemical vapor deposition (AL CVD) to apply high dielectric-constant materials. The high dielectric-constant materials used were Zirconium Zr and Hafnium Hf. Specifically, the materials were $ZrO_2$ by MO CVD, $ZrO_2$ by the AL CVD, and $HfO_2$ and $HfSiO_x$ by MO CVD.

For comparison with the above high dielectric-constant materials, three conventional types were used, which were thermal oxidation film, P-implanted amorphous silicon, and amorphous silicon.

As seen from the graph of FIG. 1, when the treating solution containing sulfuric acid is heated, the etching rates of the high dielectric-constant materials (i.e. the group referenced high-k in FIG. 1) increase around 100° C., and above 150° C. By contrast, the etching rates of the conventional materials (i.e. the group referenced Ref. in FIG. 1) hardly increase, as do those of the high dielectric-constant materials, by heating of the treating solution.

That is, where the high dielectric-constant materials are used as gate insulating oxide film, a selective treatment may be performed with the treating solution since the treating solution is operative extremely little on the conventional materials used for substrates. Since the treating solution contains sulfuric acid, organic substances may be removed completely. The substrates are free from contamination by melting of the high dielectric-constant materials.

It will be understood from the results of experiment that appropriate etching rates are obtained from the range of temperatures for heating the treating solution at approximately 100 to 200° C., and this range may be said a practical range. Thus, substrates coated with a film material containing a high dielectric material may be treated appropriately with a treating solution including sulfuric acid in 20 to 100% by weight and heated to the range of 100 to 200° C., preferably 150 to 180° C.

Figure 2A:
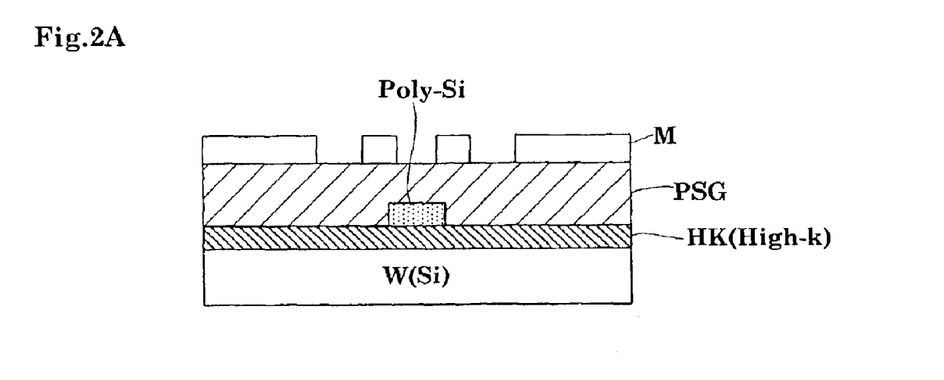
FIG. 2A shows a state before etching.
Figure 2B:
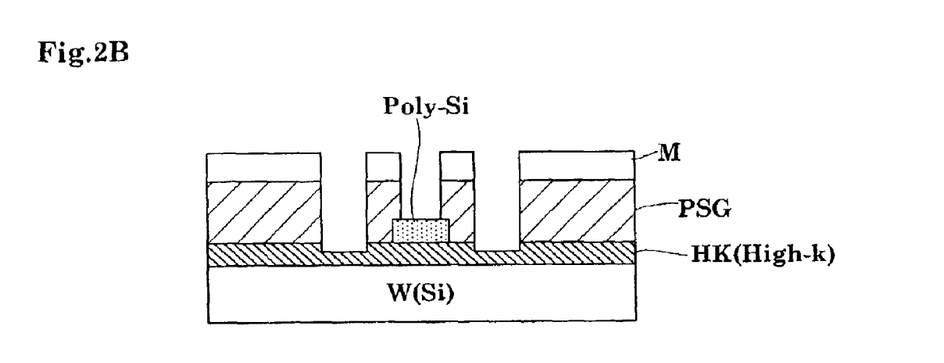
FIG. 2B shows a state after dry etching.
Figure 2C:
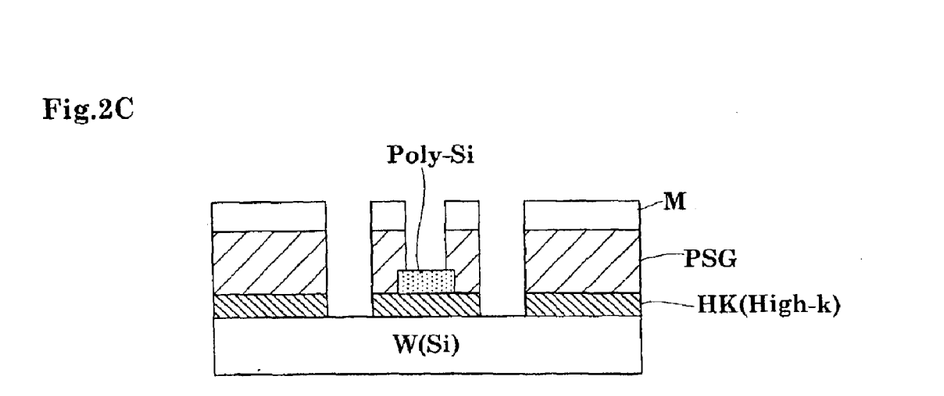
FIG. 2C shows a state after etching by a treating solution.

Next, a specific example of treatment by the above substrate treating method will be described briefly with reference to FIGS. 2A through 2C. FIGS. 2A through 2C are views illustrating a specific treatment by the method in the first embodiment, in which FIG. 2A shows a state before etching, FIG. 2B shows a state after dry etching, and FIG. 2C shows a state after etching by a treating solution.

It is assumed that a wafer W has a high dielectric-constant material (High-k) HK already applied to Si, and Poly-Si and PSG formed as gate electrodes. Further, a mask (resist) M is selectively formed on the PSG.

As shown in FIG. 2A, the wafer W with the mask M formed thereon is dry-etched. Consequently, as shown in FIG. 2B, the parts of PSG not coated with the mask M are etched, and the high dielectric-constant material (High-k) HK is dry-etched halfway in the direction of thickness.

Finally, the dry-etched wafer W is immersed in the treating solution heated to the above temperature range. Consequently, as shown in FIG. 2C, the remaining parts of the high dielectric-constant material (High-k) HK are etched and removed by the treating solution.

<Substrate Treating Apparatus>

Figure 3:
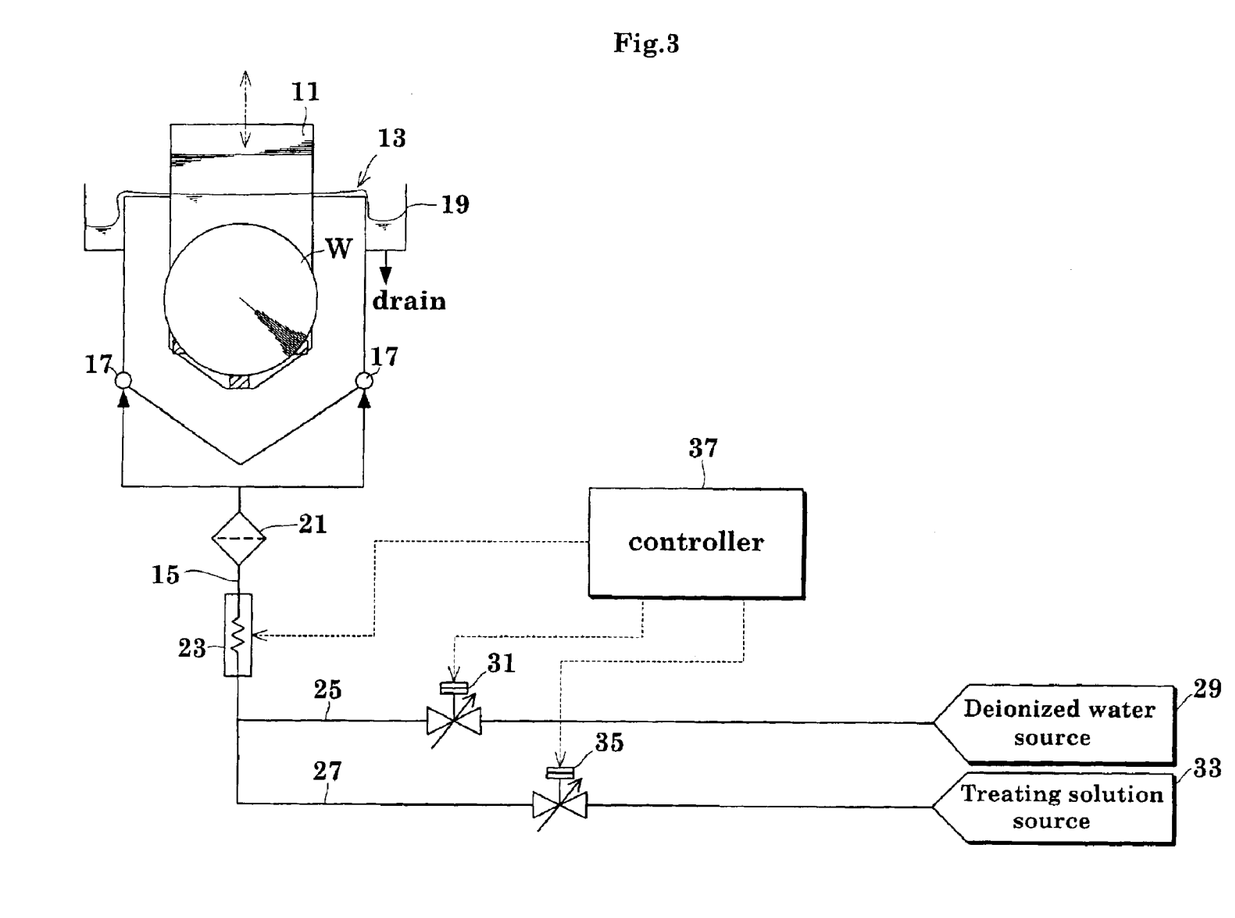
FIG. 3 is a view showing an outline of a substrate treating apparatus in the first embodiment.

Next, a substrate treating apparatus for appropriately executing the above substrate treating method will be described with reference to FIG. 3. FIG. 3 is a view showing an outline of the substrate treating apparatus in the first embodiment.

This substrate treating apparatus includes a holding arm 11, a treating tub 13 and a treating solution pipe 15. The holding arm 11 holds a plurality of wafers W for treatment, and is vertically movable between a position above the treating tub 13 and an immersing position (treating position) shown in FIG. 3. The treating tub 13 includes filling pipes 17 arranged in lower positions thereof for introducing the treating solution. The treating tub 13 further includes a collecting tub 19 formed circumferentially thereof above the filling pipes 17 for collecting and draining the treating solution overflowing the treating tub 13. The filling pipes 17 are connected to the treating solution pipe 15.

The treating solution pipe 15 includes a filter 21, a heater 23 corresponding to the heating device of this invention, a first charging line 25, and a second charging line 27. The filter 21 is provided for removing particles from the treating solution. The heater 23 heats or adjusts the treating solution to a predetermined temperature. The first charging line 25 extends from a deionized water source 29, and has a control valve 31 for controlling a flow rate of the water. The second charging line 27 extends from a treating solution source 33, and has a control valve 35 for controlling a flow rate of the solution. The treating solution stored in the treating solution source 33 is already adjusted to the sulfuric acid concentration noted hereinbefore.

A controller 37 controls opening and closing of the control valves 31 and 35 and the flow rates therethrough. The controller 37 controls the heater 23 to heat the treating solution flowing through the treating solution pipe 15 to the heating temperature noted hereinbefore. Further, the controller 37 controls the control valves 31 and 35 to adjust the density of the treating solution as necessary.

In the substrate treating apparatus having the above construction, the controller 37 opens the control valve 35 to supply the treating solution in a predetermined density to the treating solution pipe 15. The treating solution supplied to the treating solution pipe 15 and heated to the predetermined temperature by the heater 23 is supplied to the treating tub 13. After the treating solution fills the treating tub 13 and overflows into the collecting tub 19, the holding arm 11 on standby above the treating tub 13 is lowered to the immersing position shown in FIG. 3 while holding the wafers W. Upon lapse of a predetermined time, the controller 37 closes the control valve 35, and opens the control valve 31 to supply the deionized water to the treating tub 13. Consequently, the treatment of wafers W is stopped, and the wafers W are cleaned with the deionized water.

The substrate treating apparatus having the above construction can appropriately execute the substrate treating method described hereinbefore, to treat the wafers W coated with a film material containing a high dielectric material.

<First Modification>

Figure 4:
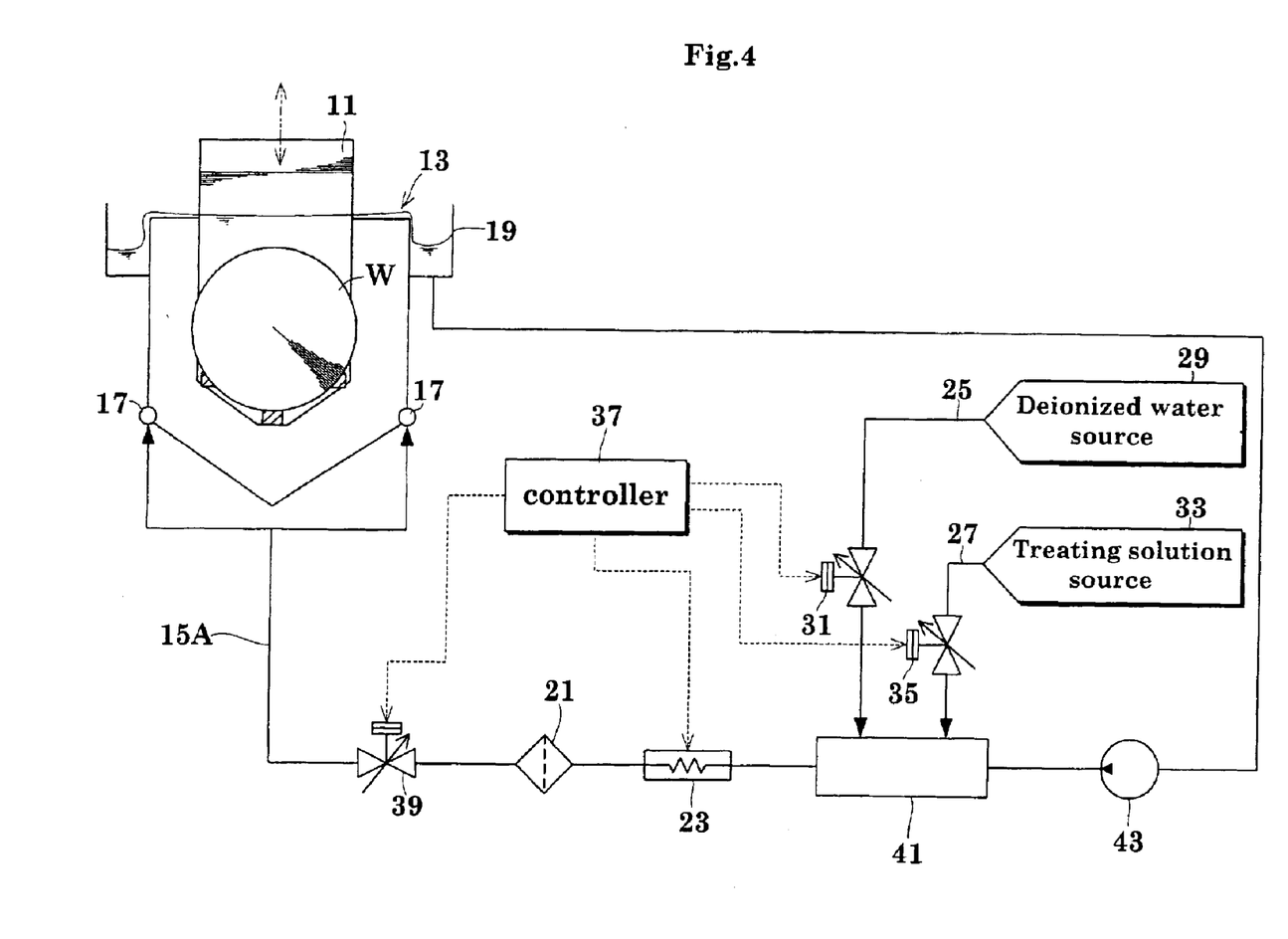
FIG. 4 is a view showing a first modification of the substrate treating apparatus.

Next, a modified substrate treating apparatus will be described with reference to FIG. 4.

Like reference numerals are used to identify like parts which are the same as in the foregoing substrate treating apparatus and will not particularly be described again.

The foregoing substrate treating apparatus drains the treating solution overflowing the treating tub 13 into the collecting tub 19. This modified apparatus circulates the treating solution overflowing into the collecting tub 19.

Specifically, a treating solution pipe 15A is connected to the filling pipes 17 and collecting tub 19. The treating solution pipe 15A has a control valve 39, a mixer 41 and a pump 43 arranged thereon. Under control of the controller 37, the control valve 39 controls circulation and flow rate through the treating solution pipe 15A. The mixer 41 feeds the deionized water from the deionized water source 29 and the treating solution from the treating solution source 33 into the treating solution pipe 15A. The pump 43 circulates the treating solution and deionized water through the treating solution pipe 15A.

The substrate treating apparatus in the first modification produces the same effect as the foregoing substrate treating apparatus.

<Second Modification>

Figure 5:
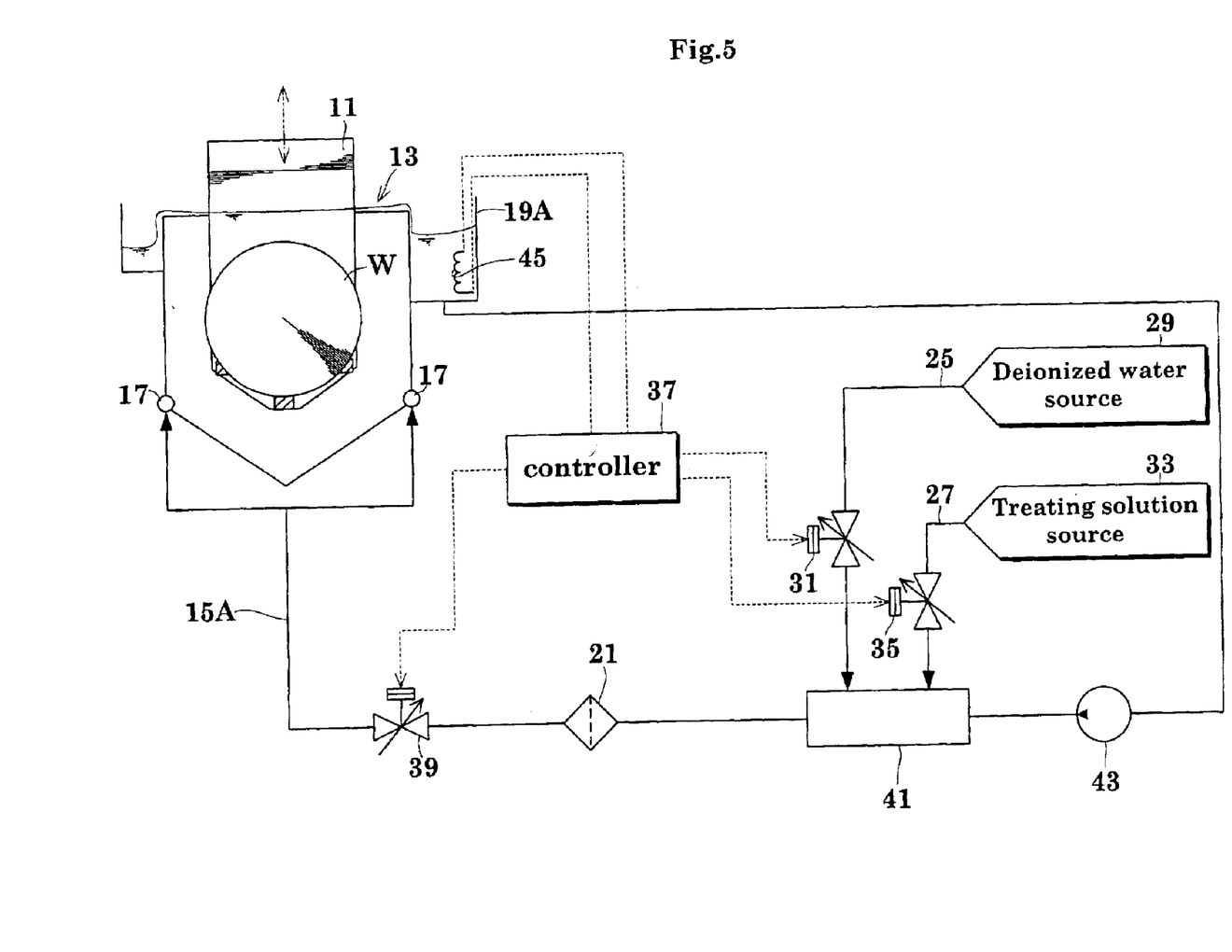
FIG. 5 is a view showing a second modification of the substrate treating apparatus.

Next, another modified substrate treating apparatus will be described with reference to FIG. 5.

Like reference numerals are used to identify like parts which are the same as in the foregoing substrate treating apparatus and will not particularly be described again.

This apparatus has no heater mounted on the treating solution pipe 15A, but provides a heater 45 for a collecting tub 19A having a slightly larger storage capacity than in the foregoing apparatus. Thus, the controller 37 controls the heater 45 to heat the treating solution overflowing into the collecting tub 19A to the temperature range noted hereinbefore. The pump 43 circulates the heated treating solution through the treating solution pipe 15A between the treating tub 13 and collecting tub 19A.

The substrate treating apparatus having the described construction produces the same effect as the foregoing apparatus. This apparatus, though its heating efficiency is lower than that of the foregoing apparatus, has an advantage that the treating solution pipe 15A is simplified.

While the apparatus described hereinbefore is designed for batch processing to treat a plurality of wafers W en bloc, the invention is applicable also to piecemeal or single-substrate processing.

Second Embodiment

FIGS. 6A through 6D are partly enlarged sectional views illustrating a series of steps in a substrate treating method in a second embodiment. FIGS. 7A through 7D are schematic views showing an outline of a substrate treating apparatus for executing the substrate treating method in the second embodiment.

Figure 6A:
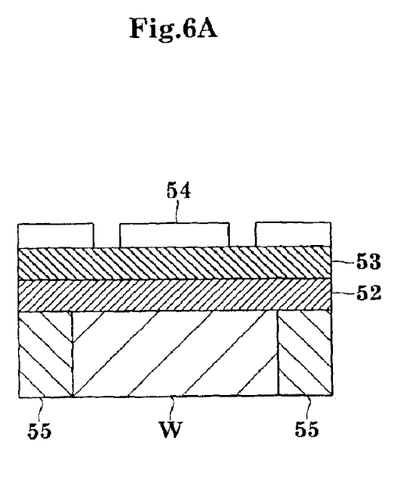
FIGS. 6A through 6D are partly enlarged sectional views illustrating a series of steps in a substrate treating method according to a second embodiment.

FIG. 6A shows a substrate, e.g. silicon wafer W, having a surface thereof coated with a high dielectric film 52 of metal oxide, with an electrode-forming film, e.g. polysilicon film 53, formed on the high dielectric film 52, and further a resist film 54 having a predetermined mask pattern formed on the polysilicon film 53. Numeral 55 in FIG. 6 denotes STI (shallow trench isolation) regions which are insulating regions for isolating adjacent devices from each other. The metal oxide forming the high dielectric film 52 is, for example, hafnium oxide ($HfO_2$) or zirconium oxide ($ZrO_2$). In the following description, it is assumed that hafnium oxide is used as the high dielectric material.

Figure 6B:
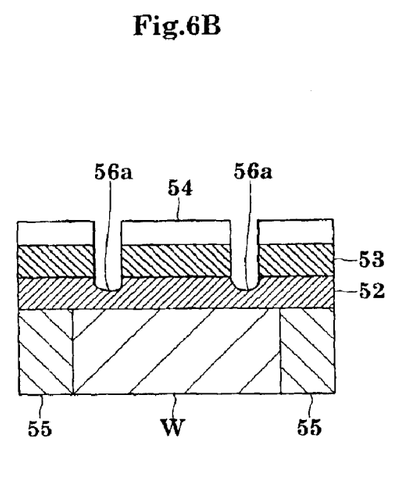

The wafer W shown in FIG. 6A is dry-etched, whereby, as shown in FIG. 6B, parts of the polysilicon film 53 not coated with the resist film 54 are etched, and the high dielectric film 52 is etched halfway in the direction of thickness, forming grooves 56a in the high dielectric film 52. However, depending on the dry etching, corners of the grooves 56a in the high dielectric film 52 are not carved, leaving unwanted hafnium oxide in the bottoms of grooves 56a, so that the grooves 56a fail to present a predetermined configuration. Then, the substrate treating method according to this invention is executed to shape the grooves 56a in the high dielectric film 52 into a desired configuration.

Figure 6C:
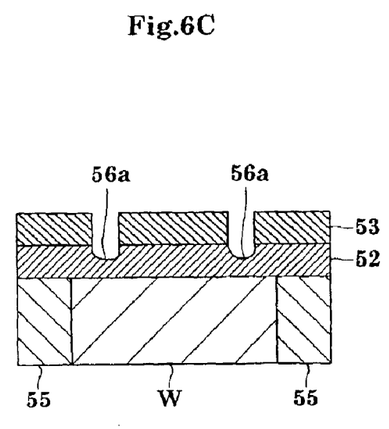
Figure 7A:
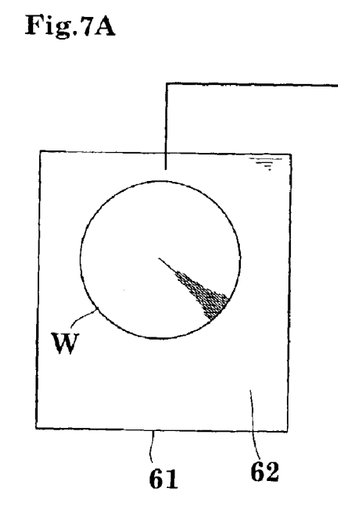
FIGS. 7A through 7D are schematic views showing an outline of a substrate treating apparatus for executing the substrate treating method in the second embodiment.

The wafer W in the state shown in FIG. 6B is treated to remove the resist film 54 from the polysilicon film 53 as shown in FIG. 6C. Subsequently, the wafer W in the state shown in FIG. 6C is loaded into a treating tub 61, as shown in FIG. 7A, storing sulfuric acid, e.g. hot concentrated sulfuric acid 62, heated to 100–200° C., preferably 150–200° C. The wafer W is immersed in the hot concentrated sulfuric acid 62 in the treating tub 61. As a result, the unwanted hafnium oxide remaining in the bottoms of grooves 56a in the high dielectric film 52 on the wafer W reacts with the sulfuric acid to form hafnium sulfate. At this time, the polysilicon film 53 does not react with the sulfuric acid.

Figure 7B:
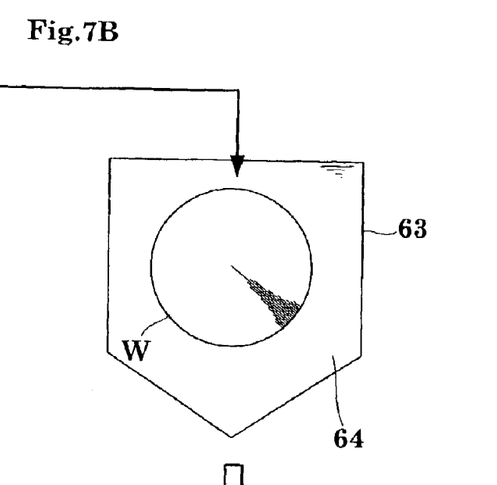

After the unwanted hafnium oxide remaining in the bottoms of grooves 56a in the high dielectric film 52 on the wafer W reacts with the sulfuric acid to form hafnium sulfate, the wafer W is withdrawn from the hot concentrated sulfuric acid 62 in the treating tub 61. As shown in FIG. 7B, the wafer W is loaded into a cleaning tub 63 storing deionized water 64. The wafer W is immersed in the deionized water 64 in the cleaning tub 63. Though not shown, deionized water is continuously supplied to the cleaning tub 63 through an inlet port formed in a bottom thereof, and is overflowing an upper portion of the cleaning tub 63. By immersing the wafer W in the deionized water 64, the hafnium sulfate on the wafer W dissolves into the deionized water 64 to be removed from the wafer W.

Figure 6D:
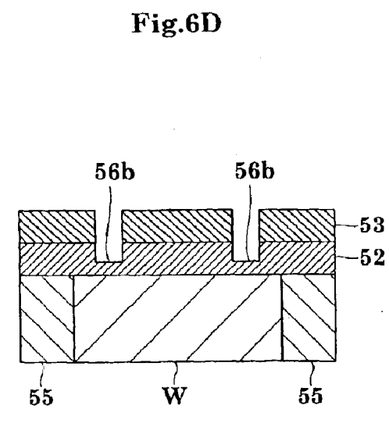

As described above, the wafer W is passed through the two steps of immersion in the hot concentrated sulfuric acid 62 and cleaning with water, whereby the high dielectric film 52 is etched selectively. As shown in FIG. 6D, the high dielectric film 52 now has the bottoms of grooves 56b shaped to the desired configuration.

Figure 7C:
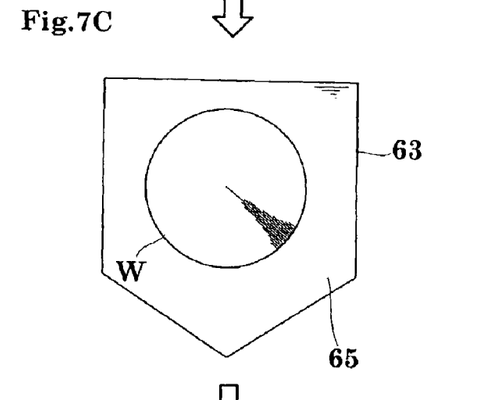

After the hafnium sulfate is removed from the wafer W by the deionized water, the wafer W is retained in the cleaning tub 63, and a cleaning solution, e.g. a mixed solution of aqueous ammonia, hydrogen peroxide water and deionized water, is supplied to the cleaning tub 63 through the inlet port formed in the bottom thereof. The cleaning solution forces the deionized water 64 out of the cleaning tub 63 at the upper end thereof. In this way, the cleaning solution replaces the deionized water 64 in the cleaning tub 63. As shown in FIG. 7C, the wafer W is immersed in and cleaned by the cleaning solution 65 in the cleaning tub 63, to remove unwanted substances such as particles from the wafer W.

Figure 7D:
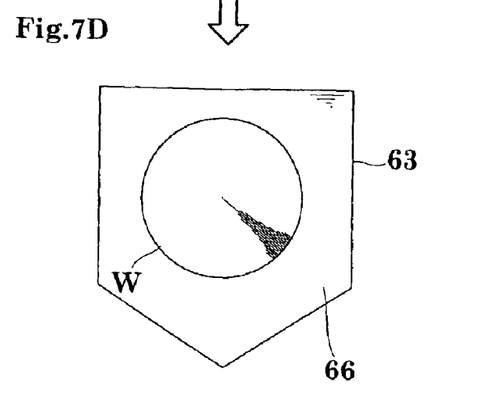

Subsequently, with the wafer W retained in the cleaning tub 63, deionized water is supplied again to the cleaning tub 63 through the inlet port formed in the bottom. The deionized water forces the cleaning solution 65 out of the cleaning tub 63 at the upper end thereof. In this way, the deionized water replaces the cleaning solution 65 in the cleaning tub 63. As shown in FIG. 7D, the wafer W is immersed in and cleaned by the deionized water 66 in the cleaning tub 63 to wash away the cleaning solution and the like adhering to the wafer W. After this cleaning step, the wafer W is withdrawn from the deionized water 66 in the cleaning tub 63, and transported to a drying unit not shown for drying the wafer W. Thereafter the wafer W may be passed to a wiring step.

The above embodiments have been described in relation to a selective etching of the high dielectric film with respect to the polysilicon film. The polysilicon film is not limitative, but the invention is applicable also to, and produces the same effect in, a selective etching of the high dielectric film with respect to silicon oxide film and silicon nitride film, for example.

In the above description, the high dielectric film formed on the substrate is selectively etched rather than the polysilicon film or the like. The invention is not limited to the selective etching of the high dielectric film, but is applicable also to a process of simply etching the high dielectric film with no relation to other films.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus etching a high dielectric-constant film of metal oxide formed on a substrate, comprising:
   a first treating unit having a first treating tub storing sulfuric acid, the substrate being immersed in the sulfuric acid in the first treating tub and thereby causing the sulfuric acid to react with the metal oxide constituting the high dielectric-constant film, thereby forming a metal sulfate, and heating the sulfuric acid to a range of 150 to 200° C.;
   wherein said oxide is selected from the group consisting of oxides of hafnium Hf and zirconium Zr, silicate, and aluminate; and
   a second treating unit having a second treating tub storing deionized water, the substrate being immersed in the deionized water in the second treating tub and thereby dissolving said metal sulfate in the deionized water, thereby removing said metal sulfate from the substrate.

2. An apparatus as defined in claim 1, wherein said treating solution has sulfuric acid in a concentration of 20 to 100% by weight.

3. An apparatus as defined in claim 1, wherein said heating unit is mounted on said treating solution pipe.

4. A substrate treating apparatus treating substrates coated with a film material containing a high dielectric-constant material, said apparatus comprising:
   a treating tub receiving and treating the substrates; said high dielectric-constant material contained in the substrates being an oxide selected from the group consisting of oxides of hafnium Hf and zirconium Zr, silicate, and aluminate,
   a treating solution pipe supplying a treating solution containing sulfuric acid to said treating tub; and
   a heating unit heating said treating solution, wherein said treating solution is heated to a range of 150 to 200° C.

5. An apparatus as defined in claim 4, wherein said treating solution has sulfuric acid in a concentration of 20 to 100% by weight.

6. An apparatus as defined in claim 4, wherein said heating unit is mounted on said treating solution pipe.

* * * * *